United States Patent [19]
Lenz et al.

[11] Patent Number: 5,942,074
[45] Date of Patent: Aug. 24, 1999

[54] SINGLE-PIECE GAS DIRECTOR FOR PLASMA REACTORS

[75] Inventors: Eric Howard Lenz, San Jose; Keith Edward Dawson, Livermore, both of Calif.

[73] Assignee: Lam Research Corporation, Fremont, Calif.

[21] Appl. No.: 08/623,967

[22] Filed: Mar. 29, 1996

[51] Int. Cl.⁶ ....................................................... C23F 1/02
[52] U.S. Cl. ................ 156/345; 315/111.21; 315/111.71; 204/298.07; 414/217
[58] Field of Search ....................... 156/345; 315/111.71, 315/111.21, 111.91; 204/298.07; 414/217

[56] References Cited

U.S. PATENT DOCUMENTS 4,632,624  12/1986  Mirkovich et al. ..................... 414/217

*Primary Examiner*—Laurie Scheiner
*Attorney, Agent, or Firm*—Irwin Ostroff; Arthur J. Torsiglieri

[57] ABSTRACT

Plasma etching apparatus for use in the manufacture of integrated circuit devices utilizes a one-piece director at an input of a process chamber that includes a sleeve portion and a bell jar portion. The director directs incoming process gas in the sleeve portion radially before the gas flows past electrodes used to establish a radio frequency discharge that ionizes the process gas. The one-piece director is clamped between the cap and the sleeve portion of the process chamber to eliminate the need for screws.

10 Claims, 4 Drawing Sheets

SINGLE-PIECE GAS DIRECTOR FOR PLASMA REACTORS

FIELD OF THE INVENTION

This invention relates to apparatus for using a plasma created in gaseous media in the manufacture of semiconductive integrated circuit devices, and more particularly, to their use in etching layers on semiconductive wafers in such manufacture.

BACKGROUND OF THE INVENTION

Currently the use of plasma etching in the manufacture of integrated circuit devices is widespread. Typically the manufacture of integrated circuit devices involves the formation of multiple layers on the surface of a semiconductive wafer, typically of silicon. These layers need to be etched to desired patterns in accordance with desired device parameters. Typically, some of the etching needs to be anisotropic, for example in the creation of substantially vertical vias in the layers to provide conductive connections to particular regions of the semiconductive wafer, and some of the etching is preferably isotropic, for example in the planarization of surfaces of the layer-covered silicon wafer to facilitate the provision of the metalization layers used to provide interconnections between the components of the integrated circuit.

Because the apparatus used for such etching is expensive, it is generally important, for keeping costs adequately low, that the apparatus be capable of high throughput. To realize high throughput, it is important to keep the down-time of the apparatus short and its maintenance easy.

Apparatus designed particularly for isotropic etching has typically included a process chamber that includes a sleeve portion of relatively small diameter, a bell jar portion of relatively larger diameter, and a load-lock base where the workpiece being etched is supported, each usually of quartz or alumina. The top of the sleeve portion is generally provided with a capped opening through which the gaseous medium used for the etching is introduced into the process chamber. After introduction the gaseous medium flows down the sleeve portion past a pair of electrodes that are disposed outside the sleeve portion and between which is maintained a suitable radio frequency (r.f.) voltage. This voltage causes a capacitive discharge that ionizes the gaseous medium as it flows past and creates the desired plasma. To create the desired r.f. field conveniently, it is desirable that the electrodes be relatively close to one another. This necessitates that the sleeve portion have a relatively small diameter, typically of about three inches at the current state of the art. However, currently wafers to be etched typically have a diameter of eight inches and the trend is to even larger diameter wafers. Accordingly, the bell jar portion and the load-lock base, within which is housed a wafer to be etched, must have dimensions that accommodate the wafers. There is accordingly a significant change in the cross-section of the path of the gas as it leaves the sleeve portion and enters the bell jar portion.

To insure isotropic etching uniformly over the entire top surface of the wafer being etched, it is important that the plasma extend relatively uniformly across the top surface. To this end, it is the practice to include a "director" element in the sleeve portion below the capped opening. This director, which is typically a multipiece assembly that is bolted to the cap, provides a central opening through which the gaseous medium is introduced for flow initially vertically into the assembly. However, the flow is thereafter diverted radially by the director towards the inner wall of the sleeve portion for flow downwards past the electrodes that create the r.f. discharge into the bell jar portion to keep the high velocity jet of the process gas from interfering with the uniformity of the plasma.

Additionally, this director, which is typically of a dielectric such as quartz or alumina, serves usefully also to isolate the cap through which the gaseous medium is introduced from the plasma.

A problem that has arisen with the use of particular gaseous media that have been found desirable for use in isotropic etching, such as media that are oxygen-rich, is the deterioration of the screws that are used to fasten the director to the cap. The materials that are convenient to use for such screws, such as vespel, tend to erode in use. This results both in undesirably high particulate matter in the bell jar and in a sufficient weakening of the screws with time that the director is not maintained securely in place. The present invention provides a solution to this problem.

SUMMARY OF THE INVENTION

The present invention is directed to a one-piece director, advantageously of alumina, that is shaped so that it can be secured in place below the cap of the plasma etching apparatus without the need for screwing to the cap of the plasma etching apparatus. In particular, the director is provided with a top portion of a first diameter that is larger than the inner diameter of the sleeve portion and rests on top of the sidewalls of the sleeve portion, a middle portion of a second smaller diameter suitable for providing a snug fit within the sleeve portion, and a bottom portion of a still smaller diameter to provide a gap between it and the sleeve wall. This bottom portion is provided with a plurality of openings radially extending from a central opening that is aligned with openings in top and middle portions in the cap for diverting flow of the process gas through the director towards side walls of the sleeve portion. Such a director can conveniently be machined from a single block of quartz or alumina. Thereafter the process gas flows past the electrodes and ultimately into the bell jar portion. Because the gas has been concentrated along the side walls of the sleeve portion, the plasma is more uniform across the workpiece that it would otherwise have been.

Viewed from one aspect, the present invention is directed to novel apparatus for plasma processing a workpiece. The apparatus comprises a process chamber, electrodes, and a one-piece director. The process chamber, which houses the workpiece to be processed, comprises at least a bell jar portion and a sleeve portion, the sleeve portion having side walls that define a passage for introducing a process gas into the bell jar portion. The electrode are disposed along the sleeve portion for ionizing the process gas as it flows past. The one-piece director directs the gas radially towards the side walls of the sleeve portion before it flows past the electrodes.

Viewed from another aspect, the invention is directed to a director for incorporation in a plasma processing apparatus that comprises a process chamber comprising at least a bell jar portion and a sleeve portion. The director comprises essentially a single integral piece comprising first, second and third portions. The first portion is of a diameter larger than an inner diameter of the sleeve portion. The second portion is of a diameter smaller than said inner diameter so as to facilitate a close fit between the second portion and side walls of the sleeve portion. The third portion is of a diameter smaller than that of the second portion and defines a plurality of radial openings therethrough extending from and intersecting with a central opening that extends through said first and second portions.

Viewed from still another aspect, the present invention is directed to apparatus for plasma etching a semiconductive wafer. The apparatus comprises a process chamber, electrodes, and a one-piece director. The process chamber, which houses the semiconductive wafer to be etched, comprises a sleeve portion, a bell jar portion, and load-lock base, the sleeve portion having side walls that define a passage therethrough for introducing an etching gas into the bell jar portion. The electrodes are disposed along the sleeve portion for ionizing the gas introduced into the sleeve. The one-piece director means, which is supported on a top edge of the side walls of the sleeve portion, directs radially the process gas in the sleeve portion before it passes the electrode means for more uniform flow when it reaches the semiconductive wafer in the load-lock base.

The invention will be better understood from the following more detailed description taken with the accompanying drawings.

The drawings are not necessarily to scale.

DETAILED DESCRIPTION

Figure 1:
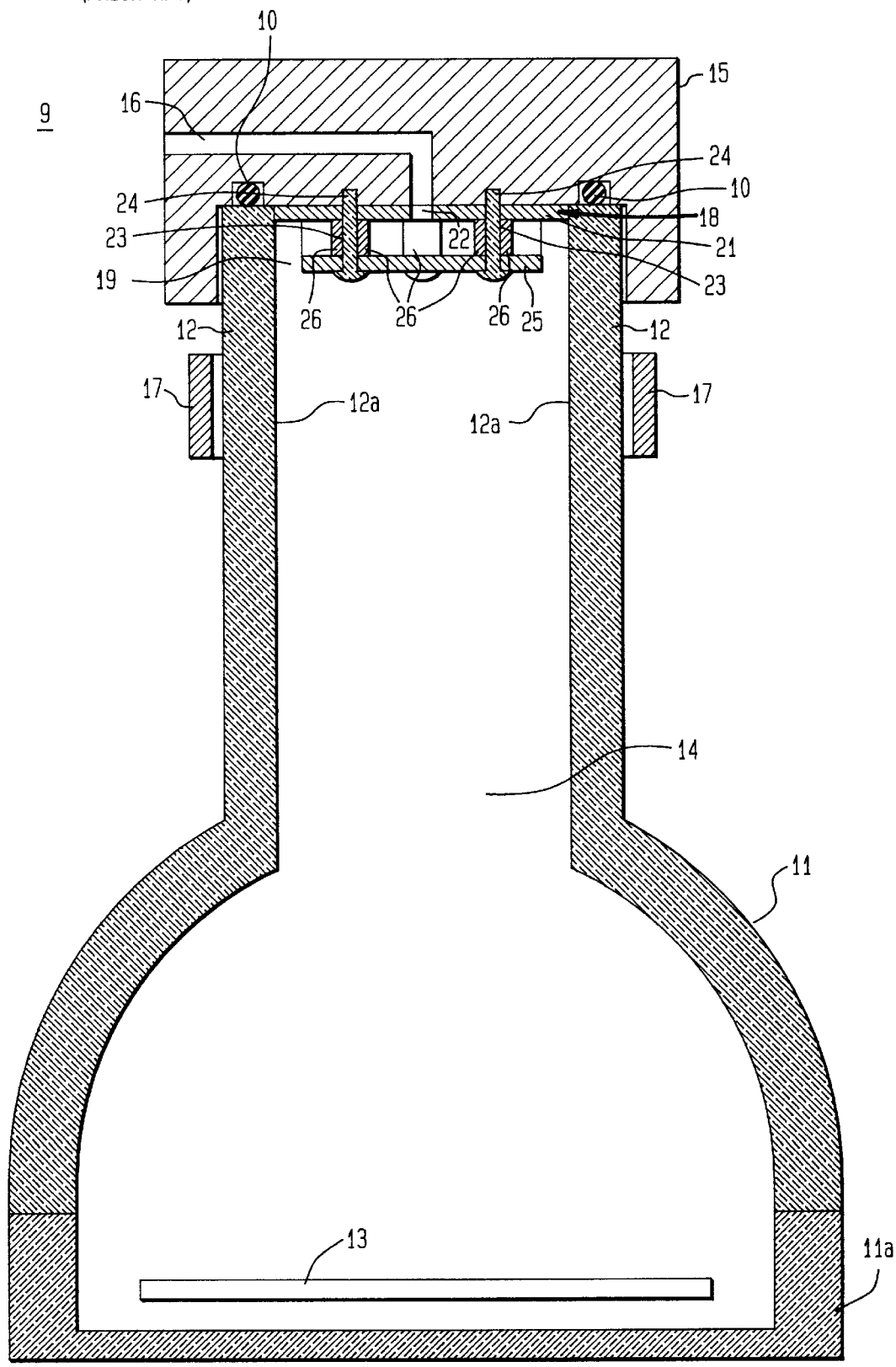
FIG. 1 shows a cross-sectional view of the basic elements of a prior art plasma etching apparatus that includes a conventional director.

FIG. 1 shows basic elements of a prior art plasma processing (e.g., etching) apparatus 9 of the kind to which the present invention is an improvement. The apparatus 9 comprises a process chamber that includes a circular-cylindrical sleeve portion 12, a hemispherical bell jar portion 11, and a load-lock base 11a, each typically of quartz or alumina. The load-lock base 11a is a of size suitable to house a platform 13 on which will be supported a workpiece (e.g., a semiconductive wafer (not shown) to be etched. The sleeve portion 12, which has side walls 12a, upwardly extends from a relatively small opening 14 in the top of the bell jar portion 11 and is designed to supply a plasma formed from the process gas that will etch a wafer placed on the platform 13. To this end, a top of the sleeve portion 12 is provided with a cap 15, typically of anodized aluminum, that includes a passageway 16 through which the process gas is introduced into the process chamber. An O-ring 10 is placed between the cap 15 and the top of the sleeve portion 12 so as to facilitate a seal between the cap 15 and the top of the sleeve portion 12 when the cap 15 is held in place by clamps (not shown). To ionize the process gas, the sleeve portion 12 is surrounded by a pair of electrodes 17 that are used to create a capacitive discharge that ionizes the process gas in known fashion. To improve the efficiency of the ionization process, it is advantageous to avoid too wide separation of the electrodes 17. This favors the use of a cylindrical sleeve of a diameter of about three inches, which is relatively small compared to a typical eight inch diameter wafer that typically is to be etched.

As is known to workers in the art, it is advantageous for increased uniformity of the etching process to interpose a "director" 18 between the cap 15 and the process chamber. This both insulates the cap 15 from the plasma to be created and directs the gas entering by way of a small central opening (hole) 22 in the director 18 to exit radially towards the side walls 12a of the sleeve portion 12 for flow past the electrodes 17.

Figure 2:
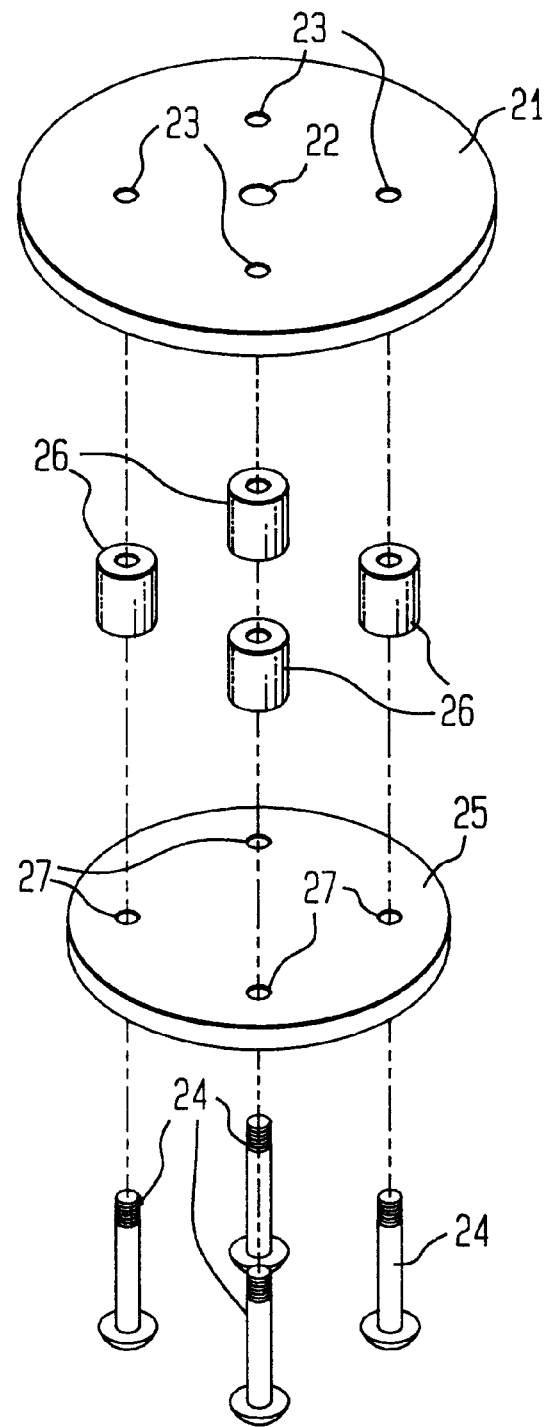
FIG. 2 shows an exploded view of the pieces of a multipiece assembly used in the prior art for the conventional director.

FIG. 2 shows an exploded three dimensional view of the director 18 of FIG. 1. Director 18 comprises an assembly of several elements held together and to the cap 15 by screws 24. In particular, the director 18 comprises an upper plate 21, a lower plate 25, four standoff rings 26, and four screws 24. The upper plate 21 is provided with the central hole 22 that aligns with the passage 16 in the cap 15 and four outer holes 23 for passage therethrough of the four screws 24 that are used to fasten the director 18 to the cap 15. Plate 21 has a diameter adequate to fit snugly between the side wall 12a of sleeve portion 12. Plate 25 has four outer holes 27 for passing therethrough the four screws 23 and has a diameter less than that of the sleeve portion 12 to leave an opening (gap) 19 between it and the side walls 12a when the plate 25 is held in place below the upper plate 21 by the bolts 24 (screws). The lower plate 25 is also held spaced from the upper plate 21 by the four standoff rings 26 through which the screws 24 are passed after passing through four holes 27 in the plate 25. The screws 24 then pass through four holes 23 in plate 21 and are screwed into a lower portion of cap 15.

In operation, process gas passes through the passage 16 in the cap 15 and enters the space between plates 21 and 25 of director 18 via aligned opening 22 and then spreads radially to pass out of the director 18 into the sleeve portion 12 by way of the opening 19. This tends to concentrate the flow of the process gas past the electrodes 17 close to the side walls 12a of the sleeve portion 12, which makes for a more uniform plasma across the workpiece in the bell jar portion 11.

As is mentioned above, a problem that has arisen with such a director 18 is the tendency of the screws 24 to erode, which has undesirable effects on the quality of the etching and so necessitates frequent replacement of the director.

Figure 3:
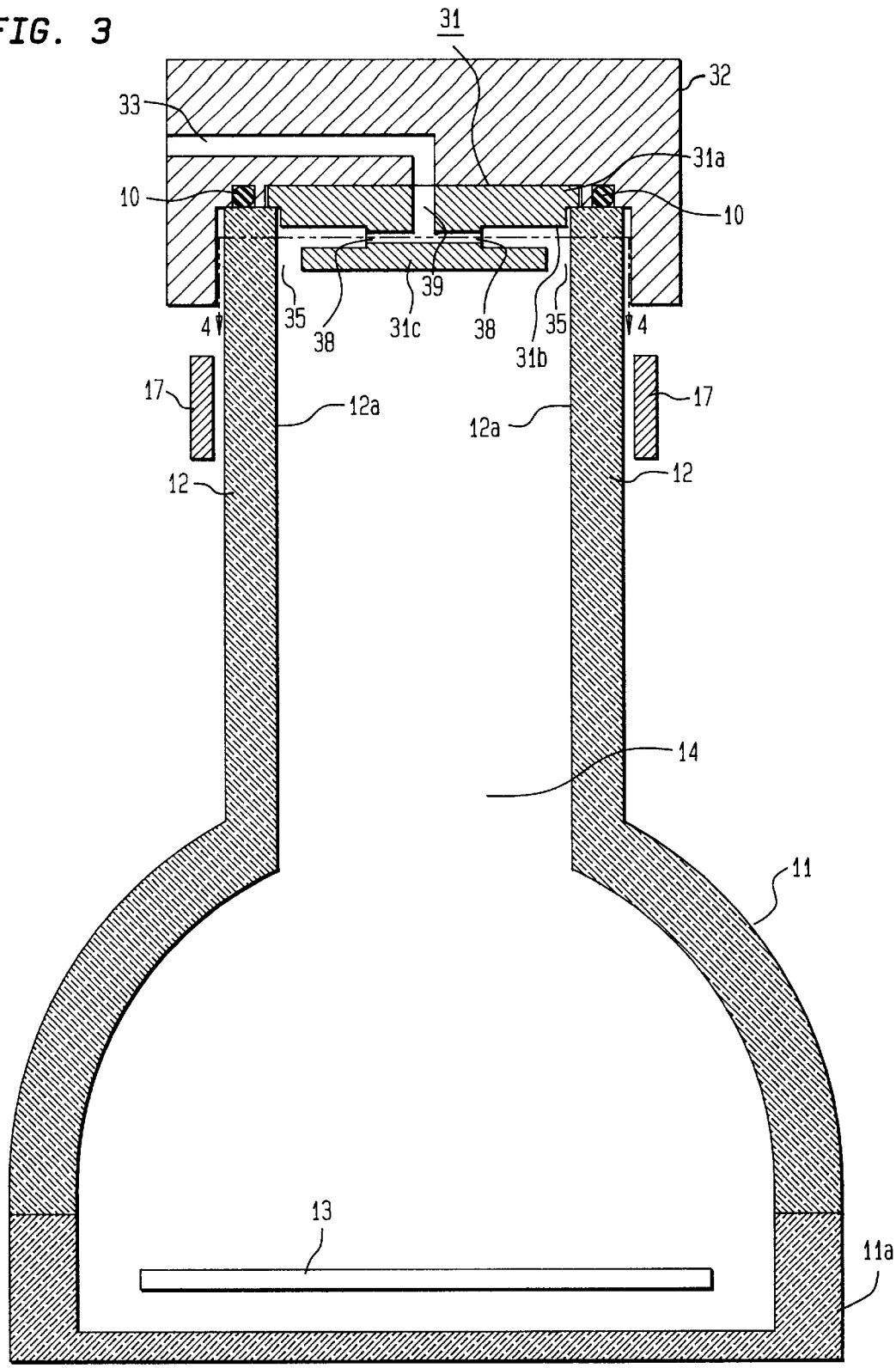
FIG. 3 shows a cross-sectional view of a plasma etching apparatus including a single-piece director in accordance with the present invention.
Figure 4:
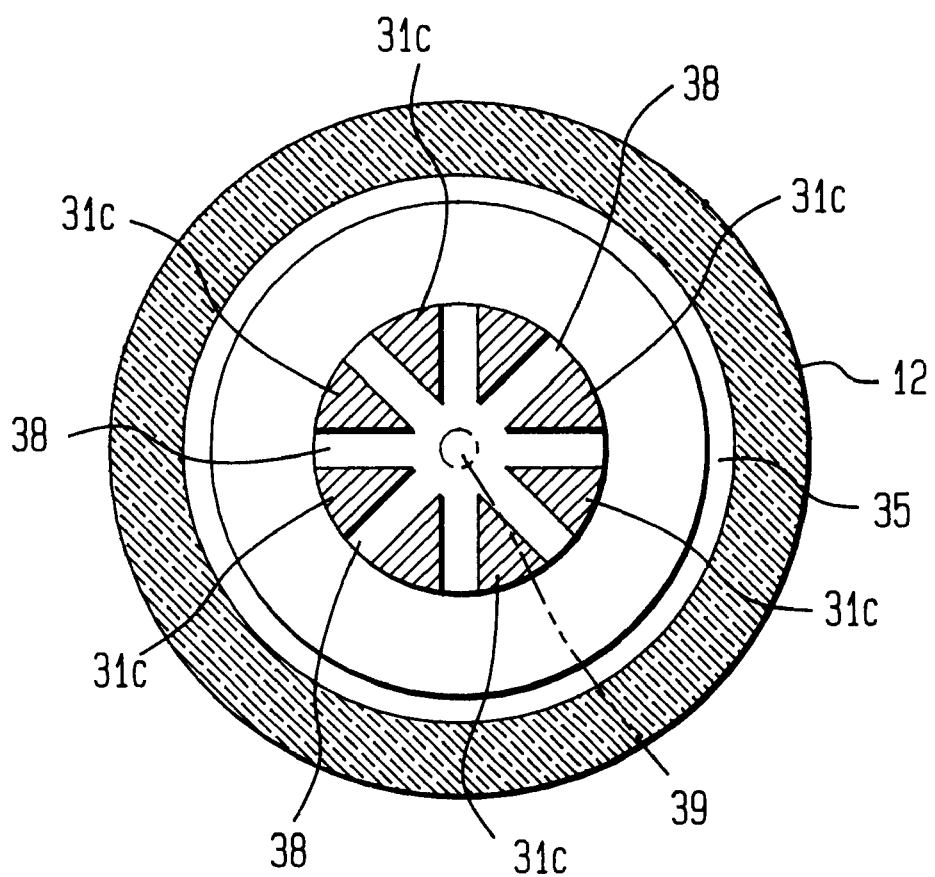
FIG. 4 shows a section of the novel director of FIG. 3. taken along a line 4—4 of FIG. 3.

FIG. 3 shows a plasma processing (e.g., etching) apparatus 30 in accordance with the present invention. Apparatus 30 is similar to apparatus 9 of FIG. 1 except that the director 18 of FIG. 1 is replaced by a novel director 31. The portions of apparatus 9 of FIG. 1. and apparatus 30 of FIG. 3 that are essentially the same use the same reference numbers. FIG. 4 shows a cross-sectional view of the director 31 and the sleeve portion 12 of bell jar 11 through a line 4—4 of FIG. 3.

An O-ring 10 is placed between a cap 32 and a top of the sleeve portion 12 so as to facilitate a seal between the cap 32 and the top of the sleeve portion 12. The sleeve portion 12 of apparatus 30 of FIG. 3 is closed at the top by the cap 32 that is provided with a passage 33 for supplying gas to the sleeve portion 12 from a suitable gas source (not shown). Intermediate between the cap 32 and the sleeve portion 12 is positioned the one-piece director 31 that is used to spread radially the process gas introduced through openings 33 in the director 31.

As seen in FIGS. 3 and 4, the director 31 comprises a top portion 31a of a diameter larger than that of the side walls 12a of the sleeve portion 12 so that the director 31 can be supported on a top edge of the sleeve portion 12 so as to close off the opening in the sleeve portion 12 except to radial openings 38 and central opening 39 in the director 31. The director 31 further comprises an intermediate portion 31b of a diameter slightly less than that of the diameter of the side walls 12a of the sleeve portion 12 to provide a snug fit with the side walls 12a of the sleeve portion 12. Additionally, the director 31 comprises a bottom portion 31c that is of still smaller diameter to leave an opening 35 between this portion and the side walls 12a of the sleeve portion 12 for the flow of process gas through the sleeve portion 12. Portion 31c is provided with a plurality of the radial passages (openings) 38, typically eight as is shown in FIG. 4. The radial openings 38 communicate with the central opening 39, through the portions 31a and 31b that is aligned with the central opening 33 in the cap 32. As shown, the openings 38 typically are circular in cross section and can be formed by drilling.

It is of course feasible to use more openings of smaller cross section if the uniformity of the radial dispersion needs to be increased.

In a typical embodiment, in which the sleeve portion 12 had an inner diameter of about 3 inches, the bell jar portion 11 has an inner diameter of about 10 inches, and the director 31 is positioned about 14 inches from the wafer support plate 13.

It should be evident that the specific dimensions and geometries mentioned are merely illustrative of an illustrative embodiment of the invention and that other geometries and dimensions are feasible. Moreover, it should be evident that the invention is not dependent on any specific process gas although it is of particular interest for plasma etching that is to be isotropic. Additionally, it should be noted that there has been omitted mention of elements non-essential to the invention yet important to the operation of the etching apparatus, such as provision for exhausting the spent process gases and circulating coolants to control the temperature of various elements in the process chamber.

What is claimed is:

1. Apparatus for plasma processing a workpiece comprising:

a process chamber for housing the workpiece to be processed comprising at least a bell jar portion and a sleeve portion, the sleeve portion having side walls that define a passage for introducing a process gas into the bell jar portion;

electrodes disposed along the sleeve portion for ionizing the process gas as it flows past; and a one-piece director for directing the gas radially towards the side walls of the sleeve portion before it flows past the electrodes.

2. The apparatus of claim 1 in which the one-piece director comprises a first portion that is of a diameter larger than the inner diameter of the sleeve portion and that is supported on a top edge of the side walls of the sleeve portion, a second portion of diameter being slightly smaller than said inner diameter for a close fit inside the sleeve portion, and a third portion of a diameter smaller than that of the second portion for leaving an opening with the sleeve side walls, said third portion including a plurality of radial openings extending from a central opening that extends through said first and second portions.

3. The apparatus of claim 1 in which the process chamber further comprises a load-lock base for housing a workpiece.

4. The apparatus of claim 3 wherein the workpiece is a semiconductive wafer.

5. The apparatus of claim 2 further comprising:

cap means, which defines an opening therethrough, for flowing the process gas from a supply source into the opening of the sleeve portion; and the one-piece director means being located between the cap means and the sleeve portion with the opening in the cap means being aligned with the central opening in the one-piece director.

6. A director for incorporation in a plasma processing apparatus that comprises a process chamber comprising at least a bell jar portion and a sleeve portion, the director comprising:

a single integral piece comprising first, second, and third portions;

the first portion being of a diameter larger than the inner diameter of the sleeve portion;

the second portion being of a diameter smaller than said inner diameter so as to facilitate a close fit between the second portion and side walls of the sleeve portion; and the third portion being of a diameter smaller than that of the second portion, said third portion defining a plurality of radial openings therethrough extending from and intersecting with a central opening that extends through said first and second portions.

7. Apparatus for plasma etching of a semiconductive wafer comprising:

a process chamber for housing the semiconductive wafer to be etched comprising a sleeve portion, a bell jar portion, and load-lock base, the sleeve portion having side walls that define a passage therethrough for introducing an etching gas into the bell jar portion;

electrodes disposed along the sleeve portion for ionizing the gas introduced into the sleeve; and one-piece director means, which is supported on a top edge of the side walls of the sleeve portion, for directing radially the process gas in the sleeve portion before it passes the electrodes for more uniform flow when it reaches a semiconductive wafer in the load-lock base.

8. The apparatus of claim 7 further comprising cap means positioned over the director for introducing the process gas into the director.

9. The apparatus of claim 7 in which the sleeve and bell jar portions, the load-lock base, and the director are of materials from a group including quartz and alumina.

10. The apparatus of claim 8 in which the cap means is of anodized aluminum.

* * * * *